US009913396B2

(12) United States Patent
Chen et al.

(10) Patent No.: US 9,913,396 B2
(45) Date of Patent: Mar. 6, 2018

(54) REVERSE MOUNT APPARATUS FOR A RACK-MOUNTED SYSTEMS

(71) Applicant: Quanta Computer Inc., Taoyuan (TW)

(72) Inventors: Chao-Jung Chen, Taoyuan (TW); Chih-Ming Chen, Taoyuan (TW); Yaw-Tzorng Tsorng, Taoyuan (TW); Ta-Chih Chen, Taoyuan (TW); Chi-Fu Chen, Taoyuan (TW); Hou-Hsien Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 14/978,036

(22) Filed: Dec. 22, 2015

(65) Prior Publication Data
US 2017/0181312 A1 Jun. 22, 2017

(51) Int. Cl.
H05K 7/14 (2006.01)
H05K 7/18 (2006.01)

(52) U.S. Cl.
CPC ........... H05K 7/1489 (2013.01); H05K 7/183 (2013.01)

(58) Field of Classification Search
CPC .... A47B 2200/0069; A47B 2200/0083; A47B 2200/0085; A47B 2210/0027; A47B 2210/0048; A47B 2210/0064; A47B 2210/0086; A47B 2210/0091; A47B 2210/08; A47B 2210/094; A47B 2220/0011; A47B 2220/0066
USPC .. 248/235, 241, 250, 220.21, 220.22, 224.7, 248/220.31, 221.11, 222.51, 225.21; 312/334.1, 334.5, 334.7, 334.8; 211/26
See application file for complete search history.

(56) References Cited

U.S. PATENT DOCUMENTS

| 7,604,308 B2 * | 10/2009 | Tseng ................... A47B 88/493 312/333 |
| 8,348,210 B1 * | 1/2013 | Lee ........................ A47F 5/103 248/220.31 |
| 8,371,454 B2 * | 2/2013 | Chen .................... H05K 7/1421 211/26 |
| 8,408,506 B2 * | 4/2013 | Yu .......................... A47B 88/43 248/219.1 |
| 8,596,471 B2 * | 12/2013 | Chen .................... H05K 7/1421 211/153 |
| 9,326,414 B2 * | 4/2016 | Eberle, Jr. ............ H05K 7/1489 |
| 2003/0168414 A1 | 9/2003 | Lauchner et al. |

(Continued)

OTHER PUBLICATIONS

Taiwan Office Action for Application No. 105104612, dated Oct. 3, 2017, with Office Action Summary.

Primary Examiner — Steven M Marsh
(74) Attorney, Agent, or Firm — Nixon Peabody LLP; Eduardo J. Quinones

(57) ABSTRACT

An apparatus for reverse mounting an electronic device in a server housing is provided. The apparatus includes a first bracket, a second bracket, and a coupling. The first bracket couples to the device body and extends outward from the device body toward a front rail of the server housing. The first bracket includes a first end configured to releasably couple to front rail of the server housing. The second bracket includes a protrusion that extends outward from the device body in an opposite direction relative to the first bracket. The coupling includes a first portion that couples to a rear rail of the server housing and a second portion defining a channel that receives the protrusion of the second bracket.

16 Claims, 11 Drawing Sheets

(56) References Cited

U.S. PATENT DOCUMENTS

| | | | |
|---|---|---|---|
| 2005/0285492 A1* | 12/2005 | Hu | A47B 88/43 312/334.4 |
| 2008/0073469 A1* | 3/2008 | Mushan | A47B 88/43 248/205.1 |
| 2008/0230496 A1* | 9/2008 | Henderson | H05K 7/1489 211/26 |

* cited by examiner

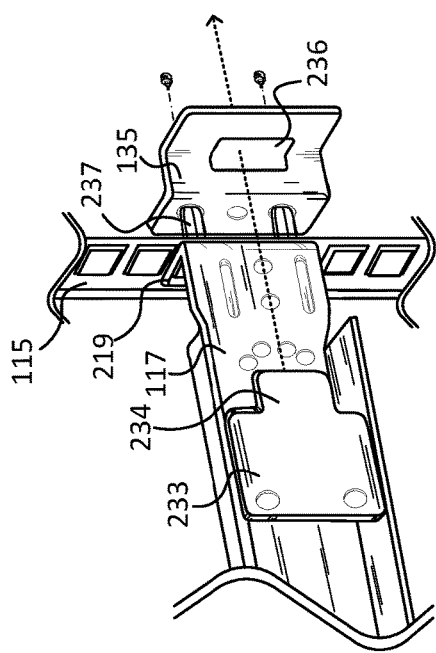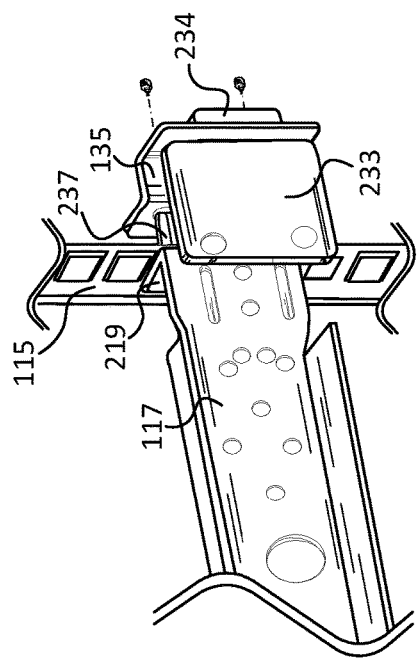

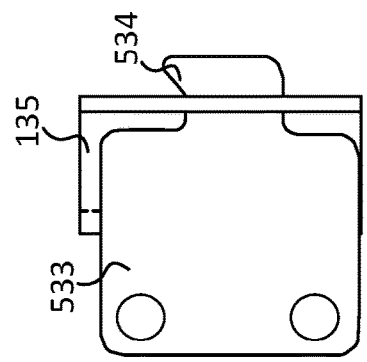
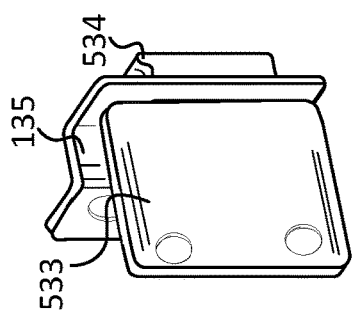
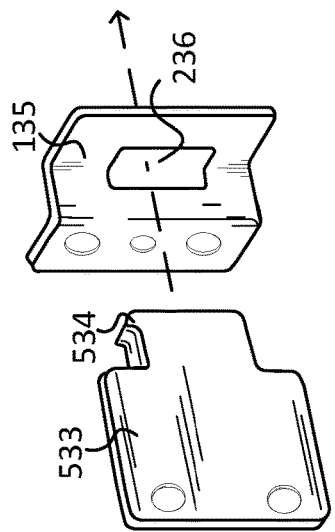

REVERSE MOUNT APPARATUS FOR A RACK-MOUNTED SYSTEMS

TECHNICAL FIELD

The various embodiments described herein relate generally to server rack structures, and more particularly, to brackets for mounting electronic devices therein.

BACKGROUND

Large-scale computing facilities typically organize and house numerous electronic devices such as servers, switches, routers, power supplies, etc., in server racks. Generally, dimensions for server racks as well as underlying support structures are standardized. For example, a typical server rack includes a rectangular housing or frame including vertical support rails or posts positioned in respective corners of the rectangular housing with various interconnecting support brackets that secure the vertical support rails together and provide overall structural integrity. Further, each vertical support rail typically includes predefined openings, or mounting holes, spaced at standard intervals along its length that receive screws or other fasteners of one or more electronic devices, including device mounting structures). In this fashion, a horizontal alignment of the pre-defined openings for each vertical support rail defines a slot or mount location for corresponding electronic devices. In turn, electronic devices are typically stacked in a shelf-like manner in respective slots of the server housing. Notably, electronic devices (including device mounting structures) are typically dimensioned to mount in respective slots of the server housing in a particular orientation—e.g., an electronic device is often mounted in a slot by sliding its rear side first into the slot to orient Input/Output (I/O) ports toward a rear side of the server rack, fastening the rear side to rear vertical support rails, and fastening a front side (e.g., opposite the rear side) to front vertical support rails.

However, in certain circumstances (e.g., maintenance, repair, removal, etc.), the particular orientation of the electronic device may be undesirable since it may prevent easy access to the electronic device (e.g., I/O ports are oriented toward a rear side of the server housing where numerous network cables for other electronic device I/O ports are also located). Further, the electronic device is often secured to both the front vertical support rails and rear vertical support rails by fasteners, which may also complicate efficient access and/or removal of the electronic device.

SUMMARY

Various examples of the disclosure provide reverse mounting techniques and apparatus that releasably secure electronic devices to a server housing. These techniques and apparatus permit, for example, electronic devices to be mounted to the server housing in a reverse orientation (e.g., relative to a pre-configured orientation and/or with I/O ports accessible from a front side of a server housing).

According to one or more examples of this disclosure an apparatus for reverse mounting an electronic device (e.g., a server, switch, router, power supply, etc.) relative to a server housing are described. Notably, the server housing can include at least one front rail proximate a housing front side and at least one rear rail proximate a housing rear side (opposite the housing front side). The apparatus can include, for example, a first bracket, a second bracket, and a coupling.

The first bracket can include an elongated body separating a first end from a second end. The first bracket may further be configured to couple to a device body (of the electronic device) and extend outward from the device body toward the at least one front rail of the server housing. For example, the device body can include a device front side and a device rear side opposite the device front side, and the first bracket can extend outward from the device rear side toward the at least one front rail. Notably, the electronic device can include input/output (I/O) ports proximate the device rear side.

In addition, the first end of the first bracket can include a flange configured to releasably couple to the at least one front rail of the server housing. With respect to coupling to the device body and/or the at least one front rail of the server housing, the first bracket can define one or more openings (e.g., on the flange) that align with corresponding holes or apertures on the at least one front rail and/or the device body to receive a fastener. In some examples, the one or more openings defined by the first bracket are defined on the elongated body proximate the second end.

As discussed above, the apparatus may also include a second bracket, which can include a tab. The second bracket may be configured to couple to the device body substantially parallel to the first bracket and extend outward from the device body in an opposite direction relative to the first bracket—e.g., a device rear side. For example, the protrusion of by the second bracket may extend outward from the device body and releasably secure to the coupling (discussed below). The second bracket, similar to the first bracket, may also define one or more openings that can align with one or more apertures on the device body to couple the second bracket to the device body substantially parallel to the first bracket. In some examples, the first bracket and the second bracket may be integrally formed.

In addition to the first bracket and the second bracket, the apparatus can also include a coupling. The coupling may a first portion and a second portion, with the first portion configured to couple to the at least one rear rail of the server housing, and a second portion that can define a channel configured to receive the protrusion of the second bracket. The coupling can releasably secure the electronic device to the server housing when, for example, the coupling is coupled to the at least one rear rail, the second bracket is coupled to the device body, and the channel receives the protrusion of the second bracket. In this fashion, the coupling is configured to releasably secure the electronic device to the server housing. In certain examples, the second bracket—e.g., the protrusion—can include a detent configured to releasably engage the second portion of the coupling when the protrusion is received by the channel. The detent may be any suitable structure such as a protrusion, a groove, a latch, a hook, etc. Further, in some examples, the first portion and the second portion may include parallel flanges—e.g., a first parallel flange corresponding to the first portion and a second parallel flange corresponding to the second portion. In these examples, the parallel flanges may be positioned parallel relative to each-other.

In some examples, the apparatus may further include fastener posts that can operate to separate the coupling from the at least one rear rail by a distance (e.g., when the coupling is coupled to the at least one rear rail). Notably, this distance can facilitate receiving the protrusion of the second bracket by the channel of the coupling.

In other examples, the apparatus and/or the server may include a guide bracket disposed between the at least one front rail and the at least one rear rail. In such examples, the guide bracket can a slide track, and the first bracket and/or the second bracket may be configured to slide the electronic device relative to the track (e.g., when the first bracket and the second bracket are coupled to the device body). In addition, the guide bracket may include opposing flanges on respective ends, separated by a guide bracket body. The opposing flanges couple with one of the front rail or the rear rail, respectively. For example, the opposing flanges may include one or more openings configured to align with openings on the front rail and/or the rear rail to receive a fastener, which secures the guide bracket to the front rail and/or the rear rail. In addition, in certain examples, the opening defined by the first bracket (e.g., on the first end) may be configured to align with one of the openings included on one of the opposing flanges of the guide bracket so as to couple the first bracket, the front rail, and the guide bracket together. Moreover, in these certain examples, the guide bracket may configured to couple to an interior side of the front rail and/or the rear rail, while the first bracket may be configured to couple to an exterior side (opposite the interior side) of the front rail. Similarly, the one or more openings defined by the coupling—e.g., defined on the first portion of the coupling—may include one or more openings that align with one or more openings of the rear rail of the server housing and one or more openings defined by one of the opposing flanges of the guide bracket that couples with the at least one rear rail.

In other examples, the apparatus may include a slide assembly and a bracket. In such examples, the slide assembly can be configured to traverse a distance between the front rail and the rear rail of the server housing and releasably secure the slide assembly to each of the front rail and the rear rail. In addition, the slide assembly may define a slide track. The bracket may be configured to couple to the device body and extend outward from the device body toward the front rail of the server housing. The bracket may also include an elongated body separating a first end from a second end, with the first end including a flange configured to releasably couple to the front rail. In addition, the elongated body may be configured to engage the slide track of the slide assembly to move the electronic device relative to the slide assembly (e.g., according to the slide track). With respect to extending outward from the device body, the bracket may extend outward from a device front side (e.g., opposite a device rear side) toward the at least one front rail of the server housing, when the first bracket is coupled to the device body.

The slide assembly may also include, for example, a telescoping bracket, an intermediate guide bracket, and a slide bracket. The telescoping bracket can be configured to extend from the at least one rear rail toward the at least one front rail and couple to the at least one rear rail. The an intermediate guide bracket may be secured to the telescoping bracket, and further configured to couple to the front rail. Notably, the intermediate guide bracket can define one of two slide tracks. The slide bracket can be configured to engage the intermediate bracket and move relative to the intermediate guide bracket according to the slide track defined by the intermediate bracket. In addition, slide bracket can also define one of the two slide tracks. In this instance, the elongated body of the bracket can be configured to couple to the slide bracket to engage the slide track defined by the slide bracket.

Details of one or more implementations are set forth in the accompanying drawings and the description below. Other features, aspects, and potential advantages will be apparent from the description and drawings, and from the claims.

BRIEF DESCRIPTION OF THE DRAWINGS

The examples and example implementations herein may be better understood by referring to the following description in conjunction with the accompanying drawings in which like reference numerals indicate identical or functionally similar elements. Understanding that these drawings depict only exemplary implementations of the disclosure and are not therefore to be considered to be limiting of its scope, the principles herein are described and explained with additional specificity and detail through the use of the accompanying drawings in which:

FIG. 4A illustrates a partial perspective view of one side of the reverse mount apparatus shown in FIG. 1, showing a guide bracket coupled to a rear rail in the server system;

FIG. 4B illustrates a partial perspective view of one side of the reverse mount apparatus shown in FIG. 1, showing the reverse mount apparatus engaged with the guide bracket and coupled to the rear in the server system;

FIG. 5A illustrates a partial perspective view of a reverse mount apparatus according to another example of this disclosure;

FIG. 5B illustrates a partial perspective view of the bracket of FIG. 5, showing the reverse mount apparatus releasably secured to a coupling;

FIG. 5C illustrates a side elevation view of the bracket shown in FIG. 5B;

DETAILED DESCRIPTION

Figure 1:
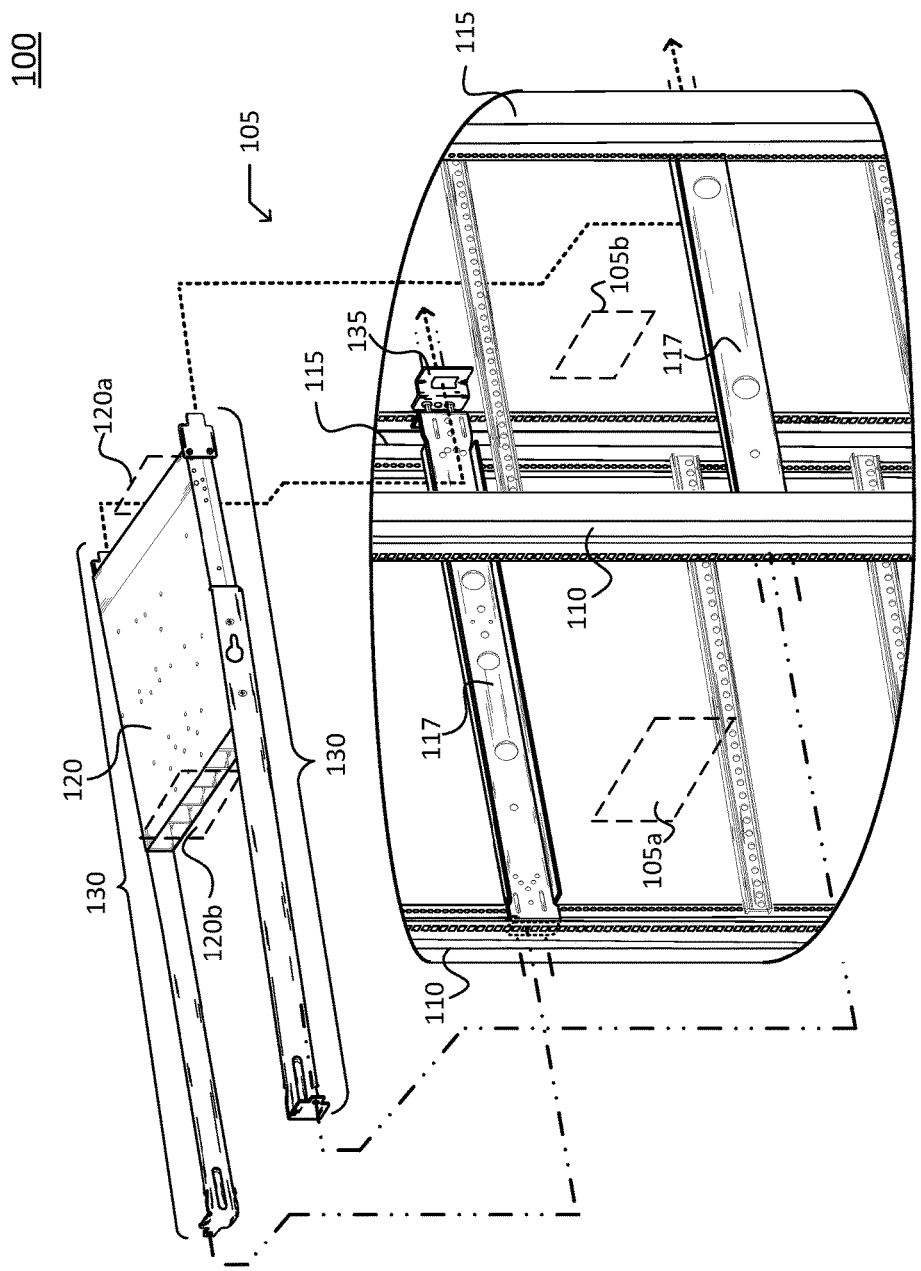
FIG. 1 illustrates a partial perspective view of a server system, showing a portion of a server rack and a reverse mount apparatus according to one or more examples of this disclosure.

Various examples of the disclosure are discussed in detail below. While specific implementations are discussed, it should be understood that this is done for illustration purposes only. A person skilled in the relevant art will recognize that other components and configurations may be used without parting from the spirit and scope of the disclosure.

As used herein, the term "front", "rear", "left" and "right" or other terms of direction, orientation, and/or relative position are used for explanation and convenience to refer to certain features of a reverse mount apparatus of this disclosure. However, these terms are not absolute, and should not be construed as limiting this disclosure.

As discussed above, large-scale computing facilities typically organize electronic devices (e.g., servers, switches, routers, power supplies, etc.) in server racks, with each server rack including numerous of rack positions or slots that horizontally stack electronic devices in the server housing. Electronic devices are often secured to the front side and rear side of the server housing with screws and further, the electronic devices are typically pre-configured to be mounted in a particular orientation. Ultimately, this may complicate access to one or more electronic devices in the server housing.

Accordingly, it may be advantageous to mount an electronic device in a server rack in a reverse orientation (e.g., relative to its pre-configured orientation and/or with I/O ports accessible from a front side of a server housing). For example, reverse mounting electronic devices in the server rack may provide a technician easy access to I/O ports, network cables, etc., and may facilitate efficient removal of the electronic device.

As discussed in greater detail below, the reverse mount bracket assemblies may include an after-market adapter that provides flexibility for orienting electronic devices to a server housing. As discussed above, electronic devices are typically configured to mount to a server housing in a particular direction or orientation—e.g., some electronic devices may have integrated mounting structures and/or may be shipped with pre-configured or default mounting brackets that secure the electronic device in the particular direction/orientation in a server housing. Typically the direction and orientation for electronic devices in a server housing position Input/Output (I/O) ports for each respective electronic device proximate a rear side of the server housing. The reverse mount bracket and reverse mount bracket assemblies disclosed herein may be configured and dimensioned to couple with various electronic devices and releasably secure electronic devices to server housings in a reverse orientation (e.g., relative to a pre-configured orientation), and offer efficient access to electronic devices through a front side of a server housing. Notably, an electronic device may include default brackets for mounting to a server housing—as is appreciated by those skilled in the art, such default brackets may be removed from the electronic device and replaced by the reverse mount brackets and reverse mount bracket assemblies discussed herein.

FIG. 1 illustrates a partial perspective view of a server system 100 having a server housing 105. As shown, server housing 105 includes a front side, generally designated by reference number 105a, and a rear side opposite the front side, generally designated by reference number 105b. As discussed herein, front side 105a of server housing 105 is defined, in part, by a plane formed by rails 110, and rear side 105b of server housing 105 is defined, in part, by a plane formed by rails 115.

Front side 105a includes a pair of rails 110, and rear side 105b includes a pair of rails 115. Rails 110 and rails 115 serve as vertical supports or posts for server housing 105 and are typically interconnected by various brackets for structural integrity. In addition, rails 110 and 115 include openings, apertures, or mounting holes configured to align with corresponding mounting holes on electronic devices and/or mounting structures for electronic devices. For example, server housing 105 includes a pair of guide brackets 117 interconnected between rails 110 and 115. Each guide bracket 117 couples to a pair of respective rail 110 and further includes respective shelf portions, which define a slot between corresponding rails 110 and 115 to receive an electronic device such as an electronic device 120. Notably, electronic device 120 is illustrated as a switch, but it is appreciated that any number of electronic devices (e.g., servers, routers, power supplies, etc.) may be substituted as appropriate.

FIG. 1 also shows a reverse mount assembly 130 configured to reverse mount electronic device 120 in server housing 105. Operatively, reverse mount assembly 130 couples to electronic device 120 and releasably secures electronic device 120 to rails 110 and 115 of server housing 105 in a reverse orientation. Specifically, reverse mount 130 orients a front side of electronic device 120 (generally designated by reference number 120a) proximate to rear side 105b of server housing 105 and orients a rear side of electronic device 120 (generally designated by reference number 120b) to face front side 105a of server housing 105. As discussed herein, front side 120a is defined, in part, by a plane formed along a front side of electronic device 120, and rear side 120b is defined, in part, by a plane formed along a rear side of electronic device 120.

Reverse mount assembly 130 is secured to electronic device 120 and couples to rails 110 using, for example, fasteners, and releasably couples to a coupling 135, which coupling is secured to rails 115. For example, coupling 135 can releasably receive a protrusion of reverse mount assembly 130, discussed in greater detail below. In this fashion, reverse mount assembly 130 releasably secures electronic device 120 to rear side 105b of server housing 105 and supports disassembly or access to electronic device 120 from front side 105a of server housing 105.

Figure 2:
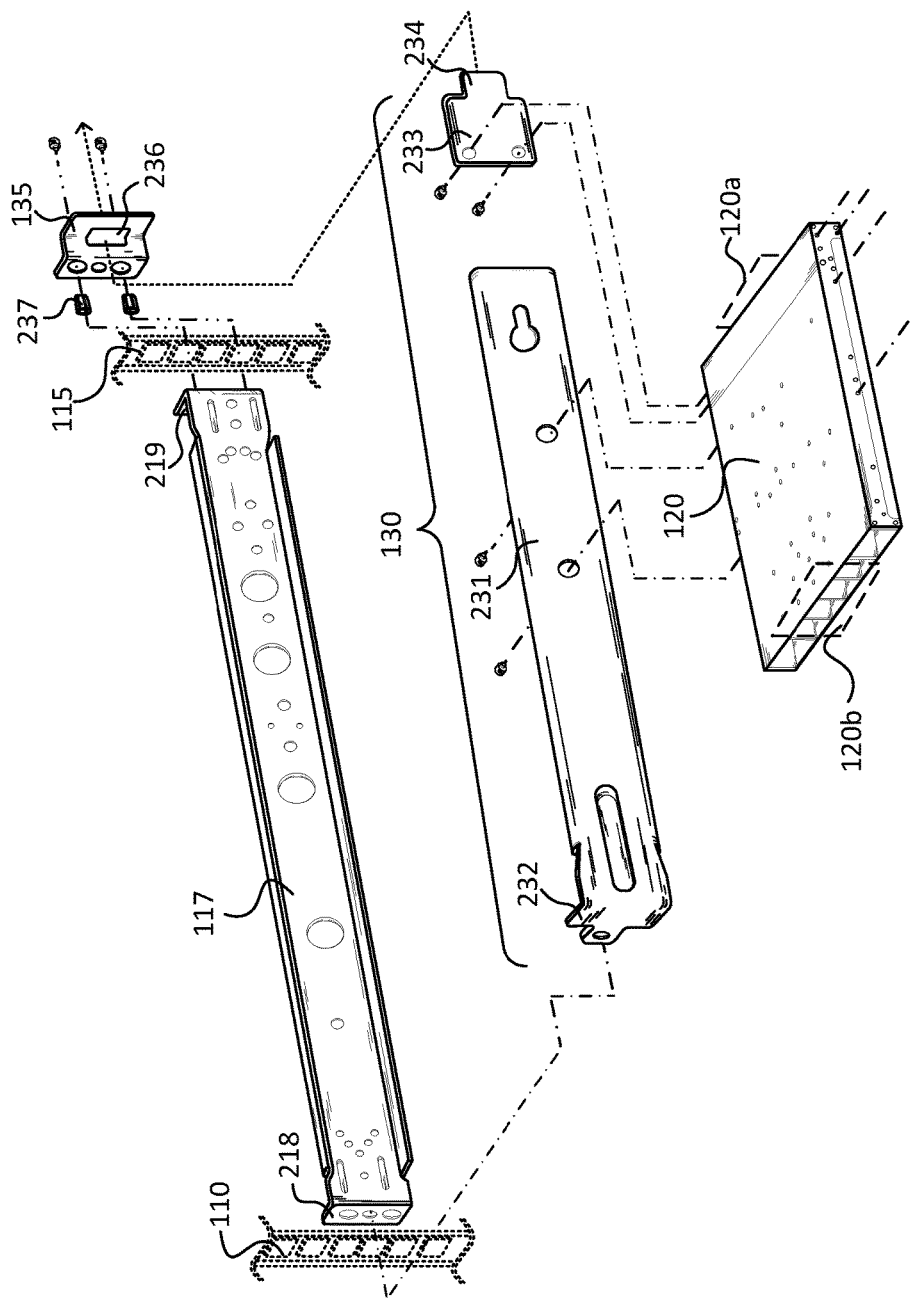
FIG. 2 illustrates an exploded perspective view of one side of the reverse mount apparatus shown in FIG. 1.

FIG. 2 illustrates an exploded perspective view of reverse mount assembly 130. As shown in this example, reverse mount assembly includes two brackets—a bracket 231 and a bracket 233.

Bracket 231 includes an elongated body separating two ends. One of the two ends—here, a first end—includes a flange 232 configured to couple to rail 110. Specifically, flange 232 defines an opening for a fastener to pass through and secure bracket 231 to rail 110. Preferably, flange 232 cooperates with a flange 218 on guide bracket 117 and aligns the elongated body of bracket 231 substantially parallel to the shelf of guide bracket 117 when flange 232 coupled is coupled to rail 110.

In particular, flange 218 of guide bracket 117 (proximate rail 110) defines multiple openings that receive fasteners to secure guide bracket 117 to rail 110. Flange 232 is preferably dimensioned to position and align its opening with one of the multiple openings of flange 218 and one of the multiple openings of rail 110. Here, the opening of flange 232 is aligned with a center opening of flange 218 and receives a fastener to secure flange 232 to rail 110 (and guide bracket 117).

Bracket 231 also includes one or more openings defined on its elongated body that align with one or more apertures on electronic device 120. The openings defined on elongated body, like the opening defined by flange 232, receive corresponding fasteners to secure bracket 231 to electronic device 120. In some examples, the one or more openings on the elongated body are positioned proximate an opposite end from flange 232.

Operatively, bracket 231 is coupled to device 120 and extends outward from device 120 (e.g., from front side 120*a*) to couple to rail 110 (e.g., via flange 232). Bracket 231 may extend from device 120 and couple to rail 110 to generally position device 120 in its slot of server housing 105 similar to a non-reverse mounted position. Put differently, bracket 231 may be extend outward from device 120, secure device 120 to rail 110, and locate device 120 in a substantially similar position in its slot of server housing 105 as the position of device 120 mounted in a non-reverse orientation.

In addition to bracket 231, reverse mount assembly 130 also includes a bracket 233, which includes a protrusion—shown as a tab 234—that releasably secures electronic device 120 to coupling 135. In particular, tab 234 is a protrusion extending beyond front side 120*a* of electronic device 120 when bracket 231 is mounted to electronic device 120. Tab 234 particularly extends beyond front side 120*a* toward coupling 135 and rail 115. In addition, bracket 233 also includes one or more openings (similar to bracket 232) that align with one or more apertures on electronic device 120 and receive corresponding fasteners to secure bracket 233 to electronic device 120. Preferably, the openings of bracket 233 are aligned with openings proximate front side 120*a* of electronic device 120.

Coupling 135 releasably secures bracket 233 in a channel 236. In particular, coupling 135 includes a first portion and a second portion—shown as parallel flanges. One of these parallel flanges couples to rail 115 and the other parallel flange defines a channel 236 to receive and releasably secure tab 234 of bracket 233. Notably, coupling 135 also defines one or more openings on the first portion to couple to rail 115. The one or more openings of coupling 135 (similar to the opening of flange 232 for bracket 231) is aligned with one or more openings defined by a flange 219 of guide bracket 117 to align channel 236 with the slot defined by guide brackets 117 that receives electronic device 120. In addition, as shown, one or more fastener posts 237 separate coupling 135 from rail 115 by a distance to facilitate coupling 135 releasably securing tab 234 in channel 236. Channel 236 is shown as a hole, but it may also be recess with a bottom, or a combination of one or more holes and/or recesses.

Operatively, coupling 135 is secured to rail 115 with one or more fastener posts 237 disposed there-between. Notably, fastener posts 237 separate coupling 135 from rail 115 by distance to facilitate receipt of tab 234. Bracket 233 is secured to electronic device 120 and tab 234 protrudes or extends outward from front side 120*a* of electronic device toward coupling 135 and rail 115. Bracket 231 is secured to electronic device 120 and flange 232 extends outward from rear side 120*b* of electronic device toward rail 110. When mounting electronic device 120 in its slot of server housing 105 (e.g., the corresponding shelves of guide brackets 117), electronic device 120 slides on guide brackets 117 with front side 120*a* oriented toward rear side 105*b*—here, front side 120*a* is oriented toward rail 115. Bracket 233 releasably couples to coupling 135 when tab 234 is received by channel 236, thus releasably securing electronic device 120 to rear side 105*b* of server housing 105. Bracket 232 is coupled to rail 110 on front side 105*a* of server housing 105, thus securing electronic device 120 to front side 105*a* of server housing 105.

Figure 3A:
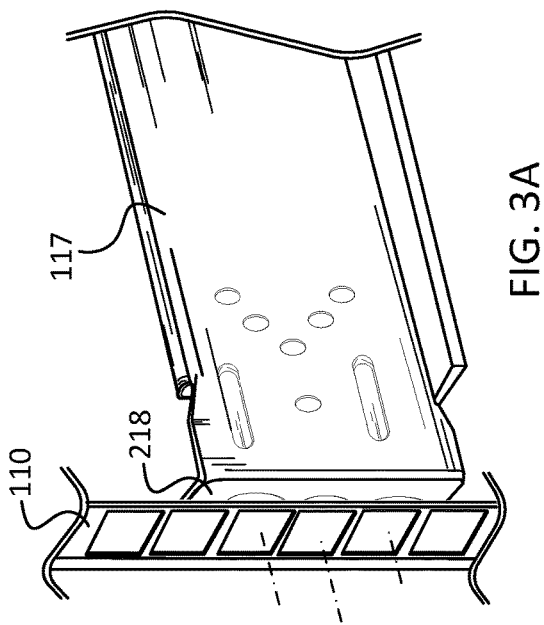
FIG. 3A illustrates a partial perspective view of one side of the reverse mount apparatus in FIG. 1, showing a guide bracket coupled to a front rail in the server system.
Figure 3B:
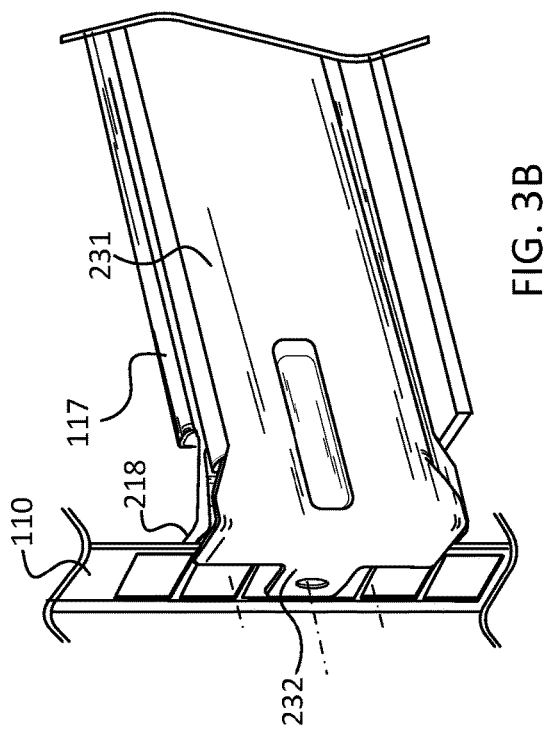
FIG. 3B illustrates a partial perspective view of one side of the reverse mount apparatus shown in FIG. 1, showing the reverse mount apparatus engaged with the guide bracket and coupled to the front rail in the server system.
Figure 3C:
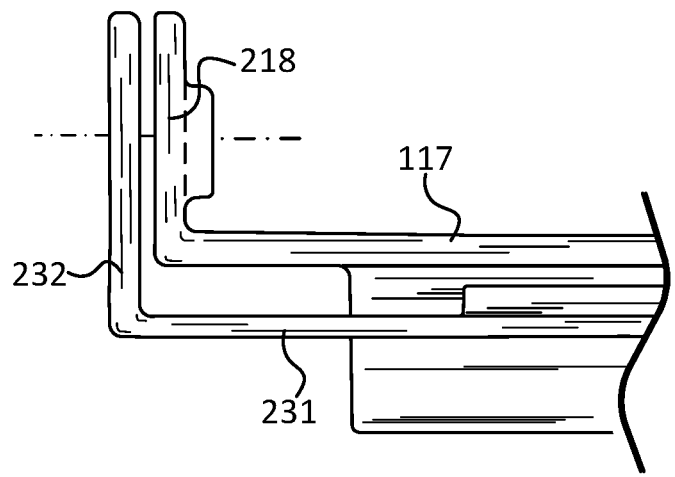
FIG. 3C illustrates a top plan view of the reverse mount apparatus shown in FIG. 3B.
Figure 3D:
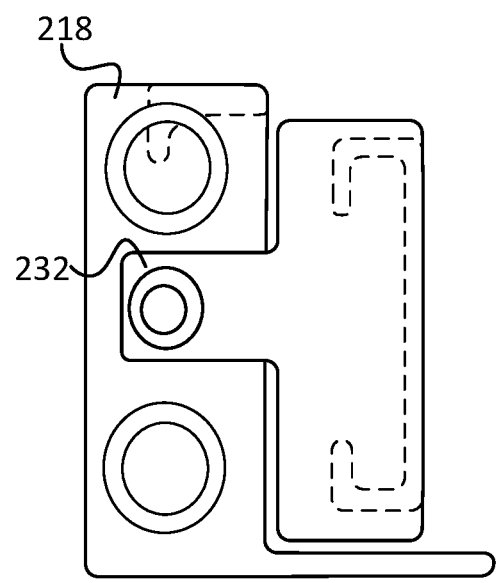
FIG. 3D illustrates a side elevation view of the reverse mount apparatus shown in FIG. 3B.

FIGS. 3A-3D illustrate various views of guide bracket 117 and bracket 231 showing respective positions when coupled to rail 110. Notably, for purposes of illustrating respective positions without undue complexity, rail 110 is not shown in each view. In particular, FIG. 3A illustrates a partial perspective view, showing guide bracket 117 coupled to rail 110; FIG. 3B illustrates a partial perspective view, showing bracket 231 and guide bracket 117 coupled to rail 110; FIG. 3C illustrates a top plan view showing a position of bracket 231 relative to guide bracket 117 when coupled to rail 110; and FIG. 3D illustrates a side elevation view, showing a position of bracket 231 relative to guide bracket 117 when coupled to rail 110.

Referring to FIGS. 3A-3D, collectively, flange 218 of guide bracket 117 defines multiple openings that receive fasteners to secure guide bracket 117 to rail 110. Here, flange 218 defines three holes vertically positioned and aligned with corresponding holes on rail 110. Flange 232 of bracket is dimensioned to position and align its opening with one of the multiple openings of flange 218 of guide bracket 117 and one of the multiple openings of rail 110. Here, the opening of flange 232 is aligned with a center opening of flange 218 to receive a fastener and secure flange 232 to rail 110 (and guide bracket 117). In addition, as discussed above, bracket 231 is positioned substantially parallel to the shelf of guide bracket 117 when flange 232 is coupled to rail 110.

Figure 4C:
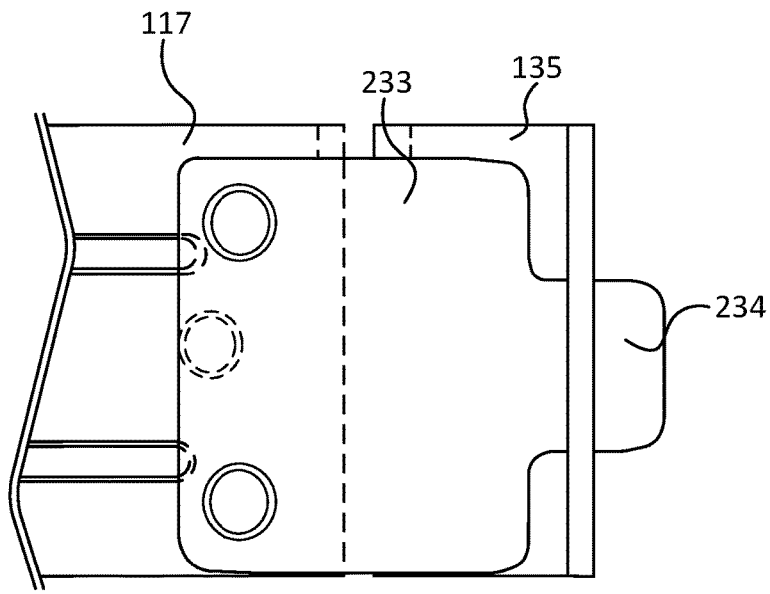
FIG. 4C illustrates a side elevation view of the reverse mount apparatus shown in FIG. 4B, generally viewed from a left side.
Figure 4D:
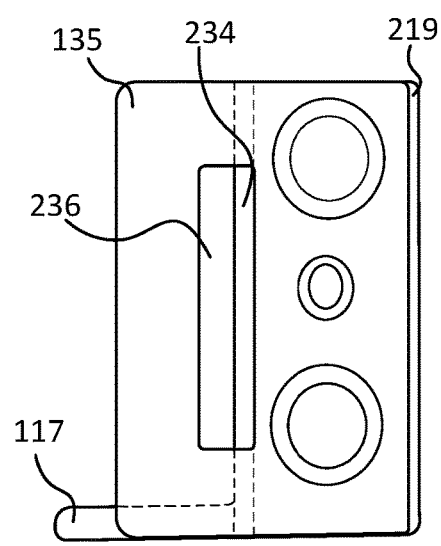
FIG. 4D illustrates a side-elevation view of the reverse mount apparatus shown in FIG. 4B, generally viewed from a front side.

FIGS. 4A-4D illustrate various views of guide bracket 117 and bracket 233 showing respective positions when coupled to rail 115. Notably, for purposes of illustrating respective positions without undue complexity, rail 115 is not shown in each view. In particular, FIG. 4A illustrates a partial perspective view, showing guide bracket 117 coupled to rail 115; FIG. 4B illustrates a partial perspective view, showing bracket 233 and guide bracket 117 coupled to rail 115; FIG. 4C illustrates a side elevation 403, showing a position of bracket 233 relative to guide bracket 117 when coupled to rail 115, generally viewed from a left side of server housing 105; and FIG. 4D illustrates a side-elevation view, showing a position of bracket 233 relative to guide bracket 117 when coupled to rail 115, generally viewed from rear side 105*b* of server housing 105.

Referring to FIGS. 4A-4D, as discussed above, coupling 135 receives bracket 233 and releasably secures tab 234 in channel 236. Coupling 135 is secured to rail 115 with posts 237 disposed there-between. Coupling 135 further defines one or more openings that align with rail 115 as well as one or more openings of flange 219 of guide bracket 117. Further, bracket 233 is secured to electronic device 120 and tab 234 protrudes or extends beyond front side 120*a* of electronic device 120 toward coupling 135 and rail 115. When electronic device is mounted in its slot in server housing 105, tab 234 interfaces with channel 236 releasably securing electronic device to coupling 135 and/or rail 115.

FIGS. 5A-5C illustrate various views of coupling 135 and a bracket 533 according to another example of this disclosure. In particular, FIG. 5A illustrates a partial perspective view of bracket 533 including a detent 534 that releasably engages with coupling 135; FIG. 5B illustrates a partial perspective view of bracket 533 releasably secured to coupling 135; and FIG. 5C illustrates a side elevation view of bracket 533 releasably secured to coupling 135.

Referring to FIGS. 5A-5C, another example bracket—here, bracket 533—is shown. Bracket 533, similar to bracket 233, can be secured to electronic device 120 and, when secured, bracket 533 protrudes or extends beyond front side 120*a* of electronic device toward coupling 135. Bracket 533 also includes a detent 534 that releasably engages with coupling 135. Operatively, coupling 135 receives bracket 533 (including detent 534) through channel 236. Detent 534 provides a catch prevents disengagement with coupling 135 until it is released. Notably, coupling 135 and channel 236 may include structures (e.g., notches, hooks, latches, etc.) that compliment detent 534 and prevent disengagement until a particular motion causes release. It is also appreciated that coupling 135 may include a detent or similar structure proximate channel 236 to releasably engage bracket 533.

Figure 6:
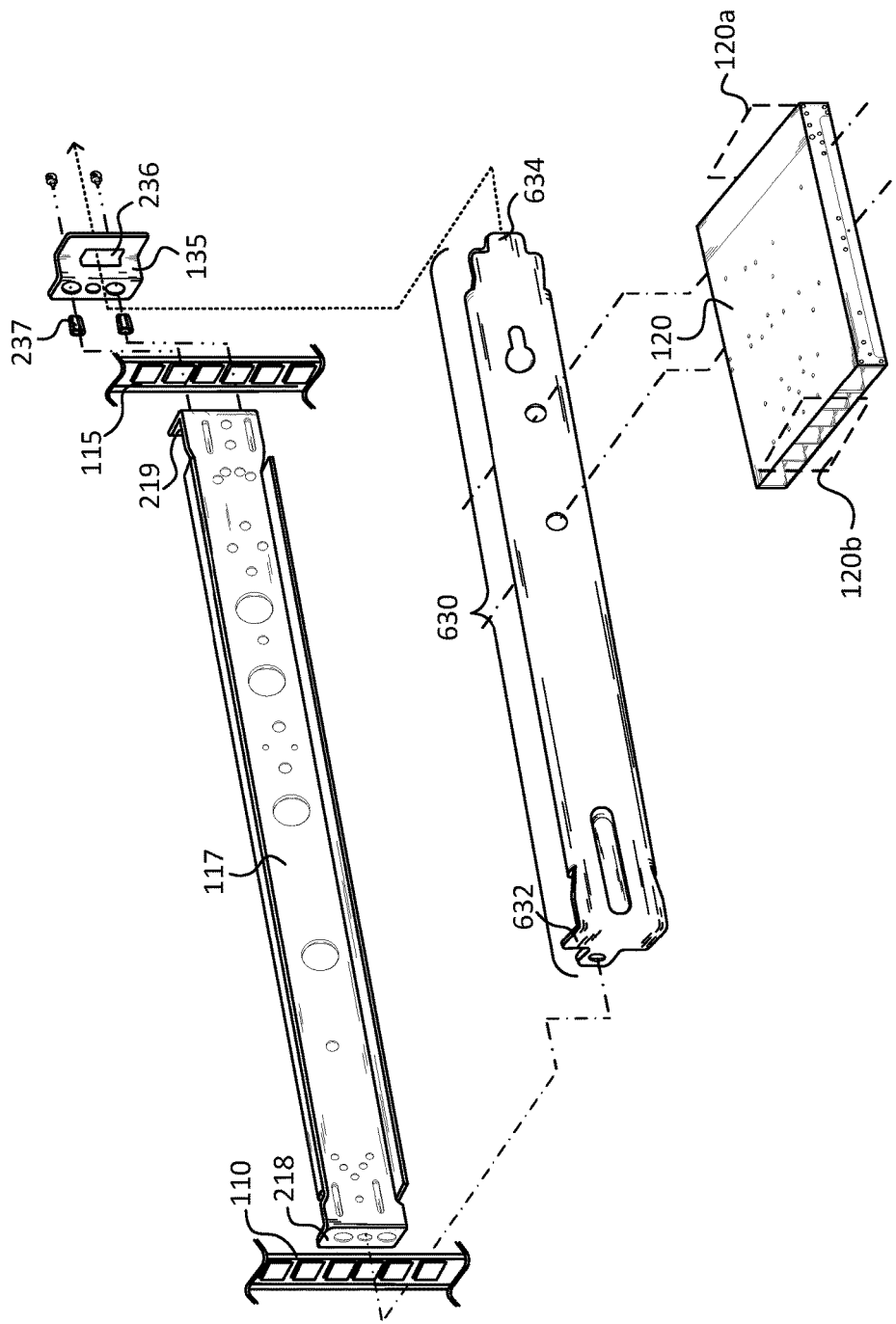
FIG. 6 illustrates an exploded perspective view of a reverse mount apparatus according to another example of this disclosure.

FIG. 6 illustrates an exploded perspective view of a reverse mount apparatus—here, a bracket 630 according to another example of this disclosure. As shown, bracket 630 is secured to electronic device 120 (e.g., using fasteners) and extends beyond front side 120a and rear side 120b of electronic device 120.

Bracket 630 includes two ends separated by an elongated body—one end includes a flange 632 that is secured to rail 110 and/or flange 218 of guide bracket 117 and one end includes a tab 634 that is releasably secured to coupling 135. Notably, bracket 630 includes similar features as brackets of reverse mount assembly 130, discussed above. However, here, bracket 630 includes an integrated design including one end including tab 634 and one end including flange 632.

Figure 7:
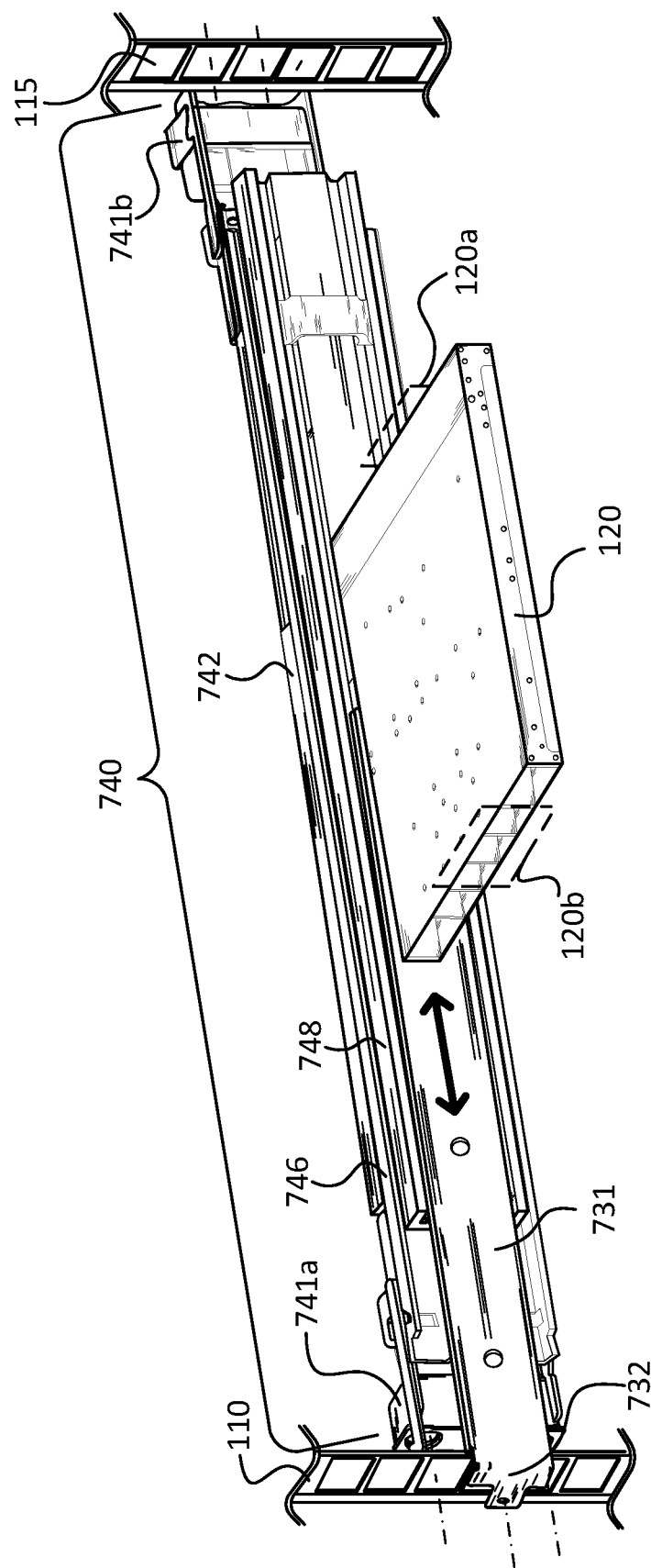
FIG. 7 illustrates a perspective view of a slide assembly according to another example of this disclosure.
Figure 8:
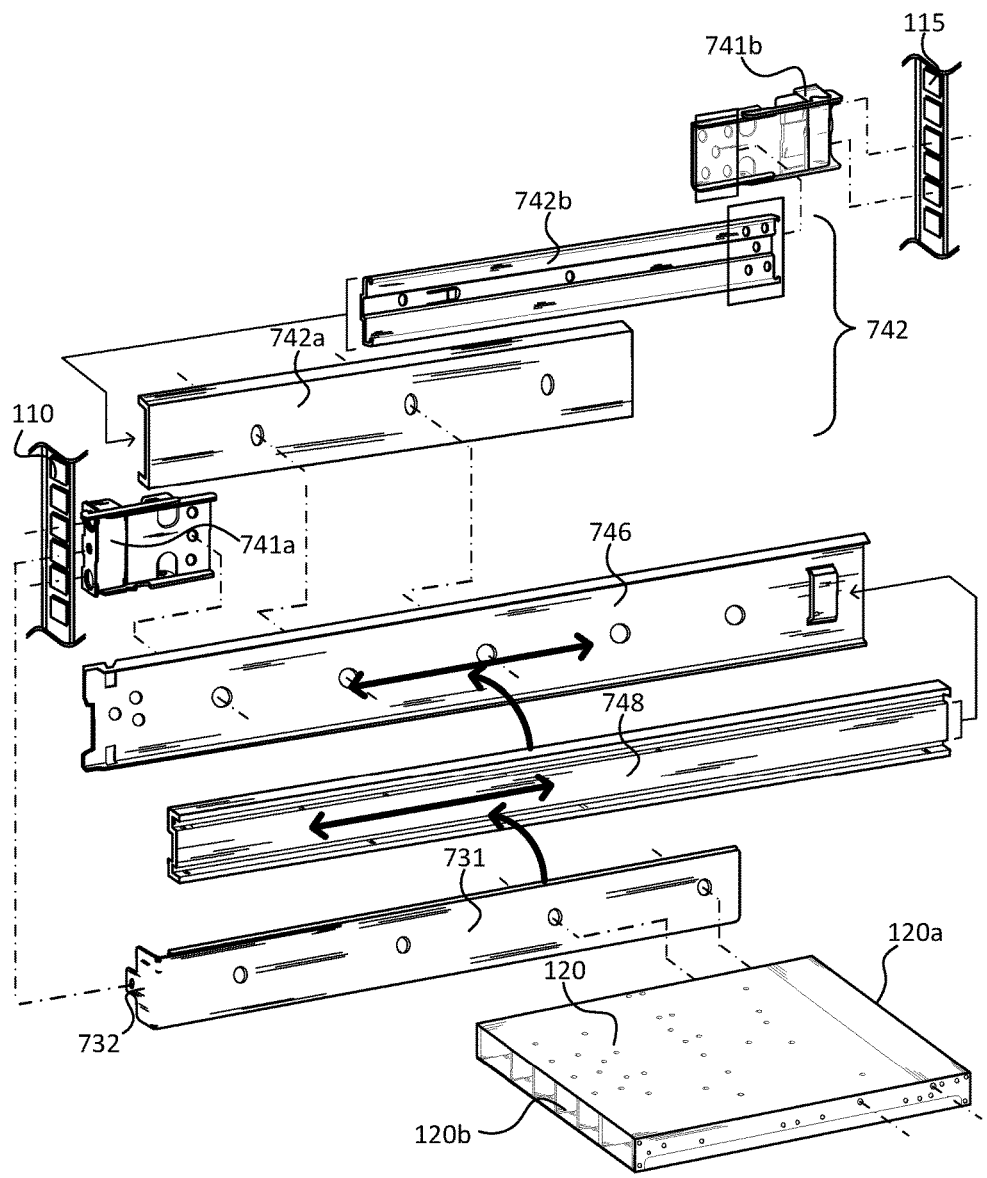
FIG. 8 illustrates an exploded perspective view of the slide assembly shown in FIG. 7.
Figure 9:
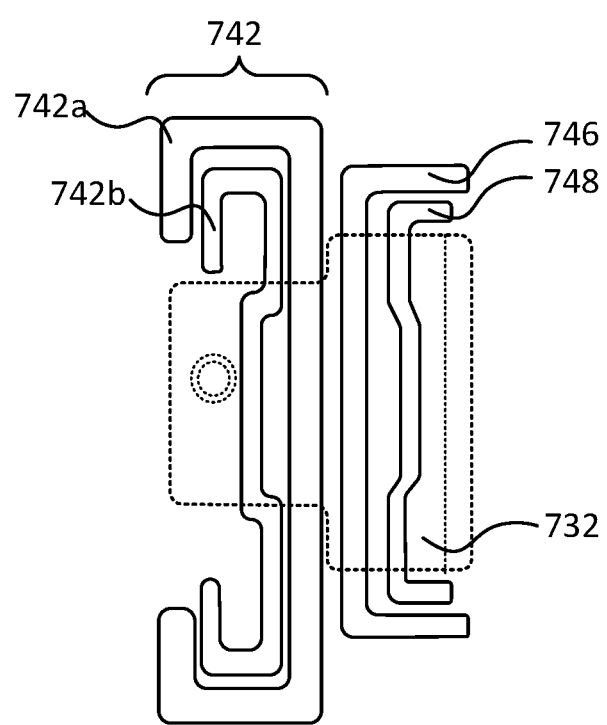
FIG. 9 illustrates a partial side-elevation view of the slide assembly shown in FIG. 7, viewed from a front side.

FIG. 7 illustrates a perspective view of a slide assembly 740 according to another example of this disclosure, FIG. 8 illustrates an exploded perspective view of slide assembly 740, and FIG. 9 illustrates a partial side-elevation view of slide assembly 740, generally viewed from front side 105a of server housing 105.

Collectively referring to FIGS. 7-9, slide assembly 740 includes a bracket 731 configured to couple to electronic device 120, rail 110, and server assembly 740. Bracket 731 includes an elongated body separating two ends, with one end having a flange 732 configured to couple to rail 110 (e.g., openings in flange 732 align with openings in rail 110 to receive a fastener). Bracket 731 further defines one or more openings on its elongated body that align with corresponding apertures on electronic device 120 for fastening bracket 731 to electronic device 120. In addition, in some examples, bracket 731 is configured to slidably couple to slide assembly 740, as discussed in greater detail below.

Slide assembly 740 is configured to secure to rails 110 and 115 using couplings 741a and 741b, respectively. As shown, a telescoping bracket 742 is secured to coupling 741b. In particular, telescoping bracket 742 includes a bracket 742a and a bracket 742b that move or slide relative to each other and traverse or extend a distance between rail 110 and rail 115, with bracket 742b secured to coupling 741b. Bracket 742a is secured to an intermediate guide bracket 746, which is secured to coupling 741a.

Intermediate guide bracket 746 includes slide rails (e.g., grooves) that define a slide track to engage a slide bracket 748 and permit slide bracket 748 to move or slide along intermediate guide bracket 746. Likewise, slide bracket 748 can include slide rails that define slide track that engage bracket 731 and permit bracket 731 to move or slide along slide bracket 748. In this fashion, electronic device 120 couples with bracket 732 and moves or slides relative to slide assembly slide assembly 740 between rail 110 and rail 115.

The devices, brackets, assemblies, and apparatus described herein, therefore, permit electronic devices to be reverse mounted in respective corresponding slots in a server housing. In particular, the reverse mount brackets and assemblies provide flexibility for orienting electronic devices in a server housing. For example, reverse mounting (e.g., mounting an electronic device in a server housing in a reverse orientation relative to a pre-configured orientation) facilitates quick and efficient access to I/O ports, network cables, and/or removal of the electronic device.

While there have been shown and described illustrative examples and example implementations for reverse mounting electronic devices in a server housing, it is to be understood that various other adaptations and modifications may be made within the spirit and scope of the example and example implementations herein. For example, the examples have been shown and described herein with reference to particular features or structures for respective reverse mounts and/or mount assemblies. However, it is expressly contemplated that such features or structures may be interchangeably included (or excluded) from other reverse mounts and/or mount assemblies (as appropriate). In addition, the examples have been shown and described with reference to fasteners or other engagement structures to releasably secure and engage the devices, brackets, and rails in a server housing. However, the examples in their broader sense are not as limited, and may, in fact, be used with any number of additional or alternative tool-based or tool-free fasteners and receptacles. For example, the fasteners or other engagement structures may include threaded fasteners, latch mechanisms, snap-fit mechanisms, spring-loaded couplings, male and female interlocking mechanisms, pills, retainers, straps, rail structures and mating channels, bossed members and slots, servo-mechanisms, electro-mechanical latches, and other suitable couplings. Further, it is also appreciated that while electronic device 120 is shown in particular orientation relative to rail 110 (associated with front side 105a of housing 105) and rail 115 (associated with rails rear side 105b of housing 105), device 120 can be oriented in an opposite direction—e.g., with rear side 120b oriented proximate rail 115, and front side 120a oriented proximate rail 110. In such examples, the mounting brackets, assemblies, and apparatus discussed herein provide efficient access to device 120 through front side 105a of housing 105. Further, it will be apparent that other variations and modifications may be made to the described examples, with the attainment of some or all of their advantages. Accordingly this description is to be taken only by way of example and not to otherwise limit the scope of the examples herein. Therefore, it is the object of the appended claims to cover all such variations and modifications as come within the true spirit and scope of the examples herein.

The invention claimed is:

1. An apparatus for reverse mounting an electronic device to a server housing, the server housing including a front rail proximate a housing front side and a rear rail proximate a housing rear side opposite the housing front side, the electronic device including a device body, the apparatus comprising:

a first bracket having a first end and a second end, the first bracket configured to couple to a side of the device body and extend outward from the device body toward the front rail of the server housing, the first end having a flange configured to releasably couple to the front rail of the server housing;

a second bracket having a protrusion, the second bracket configured to couple to the side of the device body and substantially parallel to the first bracket and extend outward from the device body in an opposite direction relative to the first bracket; and a coupling having a first portion configured to couple to the rear rail of the server housing, and a second portion defining a channel configured to receive the protrusion of the second bracket;

wherein when the coupling is coupled to the rear rail, the second bracket is coupled to the device body, and the channel receives the protrusion of the second bracket.

2. The apparatus of claim 1, wherein the coupling is configured to releasably secure the electronic device to the server housing.

3. The apparatus of claim 1, further comprising:
one or more fastener posts that separate the coupling from the rear rail by a distance when the coupling is coupled to the rear rail.

4. The apparatus of claim 1, wherein the device body of the electronic device includes a device front side and a device rear side opposite the device front side, wherein the first bracket is configured to extend outward from the device rear side toward the front rail of the server housing, when the first bracket is coupled to the device body.

5. The apparatus of claim 4, wherein the protrusion of the second bracket extends outward from the rear side of the device body, when the second bracket is coupled to the device body.

6. The apparatus of claim 4, wherein the electronic device includes input/output (I/O) ports proximate the device rear side.

7. The apparatus of claim 1, wherein the first bracket and the second bracket each define one or more openings that align, respectively, with one or more apertures on the device body to couple the first bracket to the device body and couple the second bracket to the device body substantially parallel to the first bracket.

8. The apparatus of claim 1, wherein the first portion of the coupling is a first flange, and the second portion of the coupling is a second flange, wherein the first flange and the second flange are positioned substantially parallel to each other.

9. The apparatus of claim 1, wherein the server housing comprises a guide bracket having opposing flanges separated by a guide bracket body, the opposing flanges couple with one of the front rail or the rear rail, respectively, wherein the first end of the first bracket is further configured to releasably couple to one of the opposing flanges of the guide bracket.

10. The apparatus of claim 9, wherein the first end of the first bracket includes a flange that defines an opening configured to align with an opening of the front rail and an opening defined by the one of the opposing flanges of the guide bracket.

11. The apparatus of claim 9, wherein the first portion of the coupling includes one or more openings that align with one or more openings of the rear rail of the server housing, and one or more openings defined by one of the opposing flanges of the guide bracket that couples with the rear rail.

12. The apparatus of claim 1, further comprising:
a guide bracket including a shelf to support the device body, the guide bracket configured to couple to each of the front rail and the rear rail of the server housing.

13. The apparatus of claim 12, wherein the front rail and the rear rail each include an interior side and an exterior side, wherein the guide bracket is configured to couple to the interior side of the front rail and the interior side of the rear rail, the first bracket is configured to couple to the exterior side of the front rail, and the coupling is configured to couple to the exterior side of the rear rail.

14. The apparatus of claim 1, wherein the electronic device is a switch.

15. The apparatus of claim 1, wherein the first bracket and the second bracket are integrally formed.

16. The apparatus of claim 1, wherein the protrusion includes a detent configured to releasably engage the second portion of the coupling when the protrusion is received by the channel.

* * * * *